United States Patent
Hahmann et al.

(10) Patent No.: US 6,600,162 B1
(45) Date of Patent: Jul. 29, 2003

(54) METHOD AND DEVICE FOR EXPOSING A SUBSTRATE TO LIGHT

(75) Inventors: Peter Hahmann, Jena-Drackendorf (DE); Dirk Beyer, Weimar (DE); Dorothee Krauhs, Jena (DE); Thomas Elster, Jena (DE)

(73) Assignee: Leica Microsystems Lithography GmbH, Jena (DE)

( * ) Notice: Subject to any disclaimer, the term of this patent is extended or adjusted under 35 U.S.C. 154(b) by 0 days.

(21) Appl. No.: 09/600,477
(22) PCT Filed: Nov. 16, 1999
(86) PCT No.: PCT/DE99/03639
§ 371 (c)(1), (2), (4) Date: Sep. 21, 2000
(87) PCT Pub. No.: WO00/30146
PCT Pub. Date: May 25, 2000

(30) Foreign Application Priority Data

Nov. 18, 1998 (DE) .......................................... 198 53 093

(51) Int. Cl.$^7$ ................................................. H05H 3/00
(52) U.S. Cl. ..................... 250/492.1; 250/310; 250/397
(58) Field of Search .............................. 250/492.1, 251, 250/310, 397, 307; 355/69; 428/208

(56) References Cited

U.S. PATENT DOCUMENTS 5,512,746 A * 4/1996 Saito .......................... 250/310

FOREIGN PATENT DOCUMENTS

DE 198 16 220 7/1999

OTHER PUBLICATIONS

Kiyono Tsutomu, "Electron–Beam Exposure Method", Patent Abstracts of Japan, 60117720, Jun. 25, 1985.
Yamao Tatsuhiko, "Method for Continuity to Specimen", Patent Abstracts of Japan, 03263814, Nov. 25, 1991.
Kawasaki Fuminori, "Electron Beam Exposure System", Patent Abstracts of Japan, 02125416, May 14, 1990.
Takizawa Atsushi, "Manufacture of Dry Plate in electron Beam Exposure" Patent Abstracts of Japan, 63221617, Sep. 14, 1988.
Kurokawa Junichi, "Blank Plate, Photomask Using Blank Plate, and Their Manufacture", Patent Abstracts of Japan, 01217349, Aug. 30, 1989.
Takagi Noriaki, "Production of Photomask", Patent Abstracts of Japan, 06289592, Oct. 18, 1994.
Kato Yoshihide, "Charged Beam Exposure Method", Patent Abstracts of Japan, 57099738, Jun. 21, 1982.
Yamazaki Hiroshi, "Method and Apparatus for Preventing Charging of Photomask", Patent Abstracts of Japan, 11067647, Mar. 9, 1999.

* cited by examiner

Primary Examiner—John R. Lee
Assistant Examiner—Phillip A Johnston
(74) Attorney, Agent, or Firm—Foley & Lardner

(57) ABSTRACT

The invention concerns a method for exposing a substrate (1) equipped with an n-layer photoresist system (2), an electrically conductive connection being created between a ground potential and the substrate (1) and/or at least one of the layers $S_1$ through $S_n$ of the photoresist system (2). The invention furthermore concerns an arrangement for carrying out said method. According to the present invention, what is achieved in a single process step is that by way of spring elements $E_1$ through $E_4$, a contact tip $K_1$ is advanced as far as the layer $S_1$, a contact tip $K_2$ is advanced through the layer $S_1$ as far as the layer $S_2$, a contact tip $K_3$ is advanced through the layer $S_1$ and $S_2$ as far as the layer $S_3$, and so forth. The electrical charges from the layer $S_1$ are dissipated to the ground potential via the contact tip $K_1$, the charges from the layer $S_2$ via the contact tip $K_2$, etc., and/or and from the substrate (1) via a contact tip $K_4$.

15 Claims, 3 Drawing Sheets

Ansicht A

METHOD AND DEVICE FOR EXPOSING A SUBSTRATE TO LIGHT

CROSS REFERENCE TO RELATED APPLICATIONS

This invention claims priority of a German filed patent application DE-A-198 53 093.5.

FIELD OF THE INVENTION

The invention refers to a method for exposing a substrate, equipped with an n-layer photoresist system, with a corpuscular radiation, an electrically conductive connection being created between a ground potential and the substrate and/or at least one of the layers $S_1$ through $S_n$ of the photoresist system in order to dissipate electrical charges. The invention further refers to an arrangement for carrying out this method.

BACKGROUND OF THE INVENTION

Methods and arrangements for patterning substrates, for example masks or wafers, in which the substrate is coated with a photoresist and that photoresist layer is exposed to a corpuscular radiation, for example an electron radiation, in order to impress the predefined pattern upon the substrate, are known. For exposure, the substrates are placed onto the support surface of a stage movable in the X and Y coordinates and retained there while the stage is moved step by step in the X and/or Y direction and thereby brought at successive points in time into predefined exposure positions in which the corpuscular radiation is directed at right angles, corresponding to the Z coordinate, onto the photoresist layer.

The photoresist is made of an electrically nonconductive material that becomes electrostatically charged during irradiation. The substrate can also become electrostatically charged. This side effect, referred to generally as "charging," can unintentionally result, especially in the case of photoresist layer material thicknesses>1 μm, in an influence on the radiation direction of the corpuscular radiation and thus in exposure errors and pattern defects, thus defeating efforts in the microelectronics industry toward increasingly finer patterns. To remedy this, a variety of methods and arrangements for dissipating electrical charges out of the photoresist layer and/or out of the substrate during exposure have been developed.

JP Patent 60-117720, for example, describes an electron beam exposure method in which the electrical charge is dissipated from a specimen equipped with a nitride or oxide layer by the fact that a needle made of a very hard, initially electrically nonconductive material, such as diamond, sapphire, or the like, is made conductive by the implantation of, for example, boron ions and is then used to penetrate through the layer until contact is made with the specimen. This results in grounding of the specimen via the grounded needle, and thus causes dissipation of the charge that has accumulated in the specimen during exposure. Because of the hardness of the material, the needle has a long service life, although relatively large forces must act on the needle in order to penetrate the nitride or oxide layer.

In this context, the advance movement of the needle is limited by the specimen material, i.e. the specimen constitutes the stop for the needle and prevents it from pushing forward into the specimen material beyond a desired degree. Disadvantageously, this method and the arrangement depicted in this context are suitable only for contacting a specimen concealed beneath a layer, by penetration through that layer. If, however, what is provided as the specimen is a substrate onto which a photoresist system made up of several layers has been applied, and if each of the layers is to be individually contacted and connected to a ground potential by way of a separate needle, this procedure is unsuitable, since the needles are always pushed through the entire layer structure until contact is made with the substrate.

A further JP Patent 3-263814 assumes that it is known, for example in the case of a mask board that is equipped with a chromium layer and a photoresist located above the chromium layer, to penetrate through the photoresist layer with the tip of a contact pin, to create an electrically conductive connection to the chromium layer lying therebeneath, and thereby to dissipate the undesired electrons out of the chromium layer through the pin to a ground potential. According to the patent, this method is improved in that the contact pin, upon penetration through the photoresist layer and while contact is made with the chromium layer lying therebeneath, is caused to rotate about its longitudinal axis in order to achieve reliable contact and at the same time to increase the service life of the tip of the contact pin, since the pin can now be of rounded configuration. Leaving aside the increased equipment complexity involved in a rotational drive for the pin, here again the disadvantage exists that contacting of each individual one of a plurality of layers of a photoresist system cannot be performed in this fashion.

JP Patent 2-125416 describes an arrangement for creating an electrical contact between a cassette (ground potential) and a chromium layer that is located on a mask baseplate beneath a photoresist. In this, outside the area that is reserved on the mask of the patterning, a pin is pushed by way of a leaf spring onto the surface of the (electrically nonconductive) photoresist layer. The tip of an electrode that is connected to a high-voltage source is then pushed through the photoresist, in the vicinity of said pin, as far as the chromium layer, and then a voltage of a few hundred to ten thousand volts is applied to the electrode; the photoresist thereby experiences an insulation breakdown as a result of which the pin resting on the photoresist is conductively connected to the chromium layer, and dissipation of charges occurs to the cassette via the pin and the leaf spring.

This technical solution is also not suitable, nor is it provided, for contacting each individual one of a plurality of layers of a photoresist system.

SUMMARY OF THE INVENTION

Proceeding from this existing art, it is the object of the invention to develop a method of the kind described above in such a way that in the case of a substrate equipped with a multi-layer photoresist system, before exposure begins each individual one of the layers $S_1$ through $S_n$ of the photoresist system, and if necessary also the substrate itself, is brought into electrically conductive connection with a ground potential.

According to the present invention, the object is achieved in that in a process step before exposure begins, the substrate and/or the layers $S_1$ through $S_n$ are brought into electrically conductive connection with the ground potential by way of a quantity of m contact tips $K_1$ through $K_m$, by the fact that the coated substrate and the contact tips $K_1$ through $K_m$ are moved relative to one another until the electrically conductive connection between the ground potential and the substrate and/or each individual layer $S_1$ through $S_n$ is created by way of at least one of the contact tips $K_1$ through $K_m$ in each case.

This uncomplicated process step advantageously ensures that there is created, between the ground potential and each individual one of the layers $S_1$ through $S_n$ and the substrate, an ohmic contact by way of which the electrical charges occurring during exposure are effectively dissipated. Any undesired influence on the radiation direction caused by electrical charges is thus prevented, and an essential prerequisite for accurate exposure and for a further refinement in patterns is thus created. The disadvantages of the existing art described above are thus eliminated.

According to the invention, what is achieved in a single process step is that, for example, a contact tip $K_1$ is advanced until contact is made with the layer $S_1$, a contact tip $K_2$ is advanced through the layer $S_1$ until contact is made with the layer $S_2$, a contact tip $K_3$ is advanced through the layers $S_1$ and $S_2$ until contact is made with the layer $S_3$, and so forth, and lastly a contact tip $K_m$ is advanced through the layers $S_1$ through $S_n$ until contact is made with the substrate. The electrical charges from the layer $S_1$ are dissipated to the ground potential via the contact tip $K_1$, the electrical charges from the layer $S_2$ via the contact tip $K_2$, from the layer $S_3$ via the contact tip $K_3$, and from the substrate via the contact tip $K_m$.

This procedure at the same time has another advantageous effect, namely that the contact tips $K_2$ through $K_m$ dissipate not only the charges from the layers $S_1$ through $S_m$ to which they have been advanced, but also those from the layers $S_1$ through $S_{m-1}$ that they have penetrated. For example, the contact tip $K_2$ dissipates not only the electrical charges from the layer $S_2$, but also, because of the ohmic contact created during penetration, those from the layer $S_1$. The same is analogously true of the contact tip $K_3$ with respect to the layers $S_1$ and $S_2$, and so forth.

In a variant embodiment of the invention, provision can be made for only the layers $S_1$ through $S_n$ of the photoresist system to be connected to ground potential, in the manner described, each via a contact tip $K_1$ through $K_n$. In this case the number of contact tips is equal to the number of layers.

As an alternative to this, however, it is conceivable for the number of contact tips to be greater than the number of layers. It is then possible to allocate to the individual layers $S_1$ through $S_n$ and/or to the substrate not just one but a plurality of contact tips, and thus to increase the reliability with which electrical charge is dissipated from defined layers or from the substrate. In this context, contact to selected layers and to the substrate can be made with the aid of a plurality of contact tips that are arranged at different positions on the periphery of the wafer or mask. This is advisable in particular if the layers $S_1$ through $S_n$ are segmented, and the individual segments are not electrically interconnected. For example, one contact tip can be assigned to each segment of such a layer.

It is moreover possible in this manner to allocate to each individual layer $S_1$ through $S_n$ and to the substrate, depending on the specific conductivity of the layer material, a number of contact tips which reliably guarantees rapid dissipation of resulting charges from all regions of that layer.

According to the present invention, the manner in which the contact tips are advanced relative to the coated substrate is such that the material of the particular layer to be penetrated by a contact tip is either displaced or removed.

Displacement of the material upon penetration of a layer is attained by the fact that the contact tip, acted upon by a predefined advance force, is guided on a straight motion path, preferably in the Z direction, through that layer. Because of the wedge effect upon penetration of the contact tip into the particular layer and upon further insertion, the layer material is displaced sideways in the X, Y direction.

As an alternative to this, however, a particularly preferred variant embodiment of the invention provides for the advance movement of the contact tips to take place substantially in the Z direction, but for the advance movement to have superimposed on it a component in the direction of coordinate X and/or Y. This laterally directed motion component creates a "scratch effect" as the contact tips penetrate, as a result of which the layer materials are removed by the contact tips in locally limited fashion, and intimate contact is thus made with the exposed layer.

The invention furthermore refers to an apparatus for patterning a substrate that is equipped with a plurality of layers $S_1$ through $S_n$ forming a photoresist system, in which a corpuscular radiation is directed onto the photoresist system for the purpose of exposure, and means are provided for dissipating to a ground potential the electrical charges that form during exposure in the photoresist system.

According to the present invention, in an apparatus of this kind at least a number of contact tips corresponding to the number n of layers $S_1$ through $S_n$ is provided, of which one contact tip is assigned to each of the layers $S_1$ through $S_n$ and each of the contact tips is connected to the ground potential via an electrical conductor. In addition, the coated substrate and the contact tips are arranged movably relative to one another in the direction of the corpuscular radiation.

In a preferred variant embodiment, the coated substrate is placed on a support plane that is movable in the direction of the corpuscular radiation as far as a position $Z_1$, while each of the contact tips is mechanically joined to a frame-mounted holding fixture via a separate spring element. Each contact tip is thus movable, in response to a force allocated to it and predefined by the spring element, relative to the other contact tips and also relative to the frame-mounted holding fixture.

This individual mounting of the contact tips on separate spring elements as defined by the present invention makes it possible to assign to each contact, by corresponding design of its spring element, a specific force with which that contact tip acts on the photoresist system when the substrate is shifted into the position $Z_1$.

Provision is also made, according to the present invention, for the individual contact tips to be configured with different geometries in terms of their tip angle $\alpha$ and tip radius R. It is thus possible, based on known relationships between force and area and in consideration of the thickness and viscosity of the layer materials, to coordinate the spring elements and tip geometries of the contact tips with one another and with the layer materials in such a way that a predefined penetration depth into the photoresist system is achieved when the substrate is shifted into the position $Z_1$.

For example, the tip angle $\alpha$ and tip radius R of a contact tip $K_1$ and the force $F_1$ allocated to it by the spring element $E_1$ are to be coordinated, with one another and in terms of the thickness and viscosity of a layer $S_1$, in such a way that when the support plane for the substrate is moved to the position $Z_1$, the contact tip $K_1$ cannot penetrate through the layer $S_1$ but rather simply rests on the layer $S_1$, and the electrically conductive connection between the layer $S_1$ and the ground potential connected to the contact tip $K_1$ is created.

Provision is also made, for example, for the geometry of a contact tip $K_2$ and the force $F_2$ to be coordinated, with one another and in terms of the thickness and viscosity of the layer $S_1$, in such a way that when the substrate is moved into the position $Z_1$, the layer $S_1$ is penetrated by the contact tip $K_2$ and the contact tip $K_2$ rests on the layer $S_2$, so that the electrically conductive connection between the layer $S_2$ and the ground potential is created via the contact tip $K_2$. Analogously, the geometry of the contact tip $K_3$ and force $F_3$ are coordinated, with one another and in terms of the thickness and viscosity of the layers $S_1$ and $S_2$, in such a way that when the substrate is moved to the position $Z_1$, the layers $S_1$ and $S_2$ are penetrated by the contact tip $K_3$ and the electrically conductive connection between the layer $S_3$ and the ground potential is created via the contact tip $K_3$.

This applies in the same fashion to the further contact tips; ultimately at least the geometry of the contact tip $K_n$ and force $F_n$ are coordinated, with one another and in terms of the thickness and viscosity of the layers $S_1$ through $S_{n-}$, in such a way that when the substrate is moved to the position $Z_1$, the layers $S_1$ through $S_{n-}$ are penetrated by the contact tip $K_n$ and the electrically conductive connection between the layer $S_n$ and the ground potential is ensured via the contact tip $K_n$.

The method and the arrangement according to the present invention are preferably applicable in conjunction with a substrate that is equipped with a photoresist system made up of three layers $S_1$ through $S_3$, the layer $S_1$ comprising a polymer photoresist, preferably of the designation PMMA, the layer $S_2$ comprising silicon nitride, and the layer $S_3$ once again comprising PMMA.

In this context, a very advantageous variant embodiment of the apparatus according to the present invention consists in the fact that four spring elements $E_1, E_2 \ldots E_4$, configured as leaf springs, are present, each of which is joined immovably at one end to the holding fixture while the allocated contact tip $K_1, K_2 \ldots K_4$ is attached at the respective other end. These leaf springs can have imparted to them, as a function of the layer materials and by way of varying configuration of the spring material, spring cross section, and spring length, the properties that, upon movement of the substrate into the position $Z_1$, produce spring forces $F_1$, $F_2 \ldots F_4$ which ensure that the contact tip $K_1$ reaches its allocated layer $S_1$, the contact tip $K_2$ its allocated layer $S_2$, the contact tip $K_3$ its allocated layer $S_3$, and the contact tip $K_4$ the substrate.

The forces are to be set in a range from 0.1 N to 2 N, and the tip radii of the contact tips are to be embodied in the range from 20 $\mu$m to 100 $\mu$m, while the thicknesses of the layers are between 0.5 $\mu$m and 2 $\mu$m.

BRIEF DESCRIPTION OF THE DRAWINGS

The subject matter of the invention is described with reference to the embodiments shown in the drawings.

DETAILED DESCRIPTION OF THE INVENTION

Figure 1:
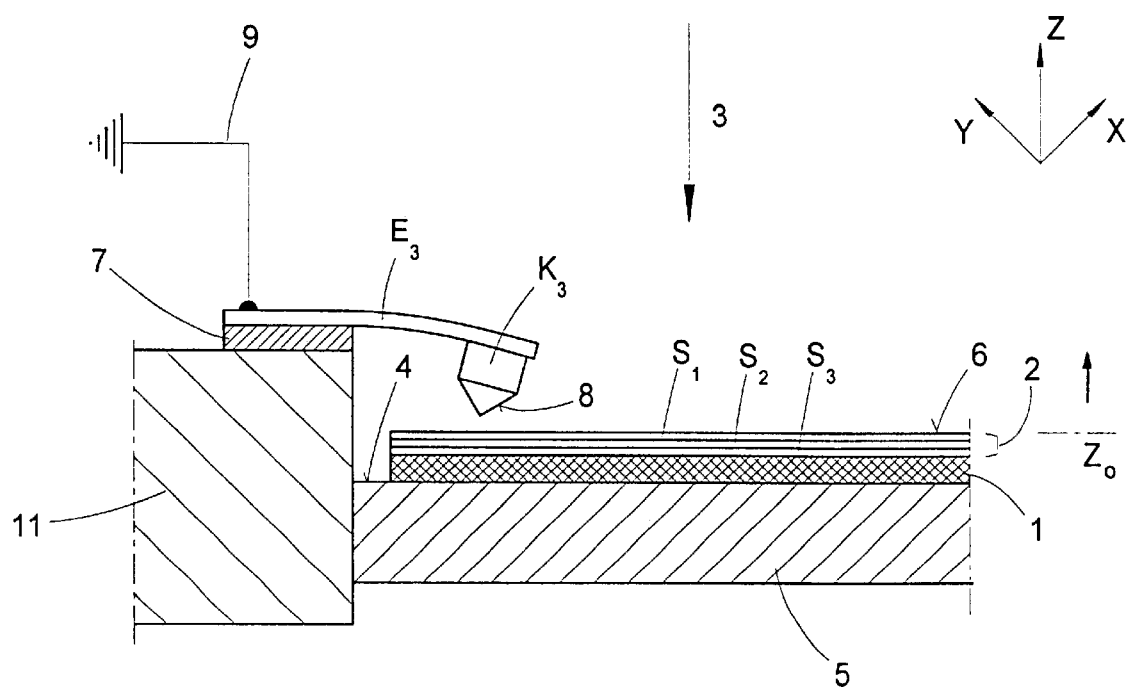
FIG. 1 shows a coated substrate before contacting.

FIG. 1 shows a portion of an apparatus for patterning a substrate 1 that is equipped with a photoresist system 2. For purposes of patterning by way of a corpuscular radiation that is directed onto photoresist system 2 in direction 3 parallel to coordinate Z, the coated substrate 1 is placed on support plane 4 of a stage 5.

Photoresist system 2 comprises layers $S_1$ through $S_3$, the layer material provided for the layer $S_1$ being PMMA, for the layer $S_2$ silicon nitride, and for the layer $S_3$ once again PMMA.

Figure 2:
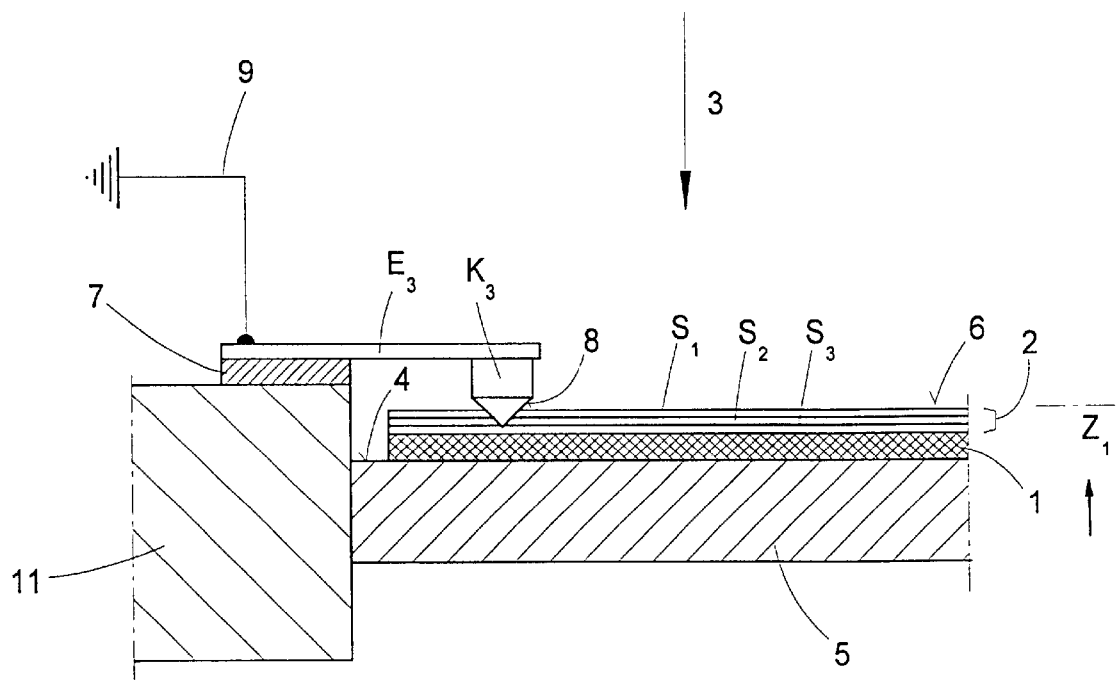
FIG. 2 shows the coated substrate in the contacted state.

Before exposure begins, substrate 1 is first positioned relative to an exposure optical system (not depicted in the drawing) by the fact that stage 5 along with substrate 1 is moved in coordinate Z out of a position $Z_0$ until a predefined distance between surface 6 of photoresist system 2 and the exposure optical system has been established. Let it be assumed that, for example, that distance is achieved at position $Z_1$ (FIG. 2). After this movement, stage 5 with substrate 1 can be moved in steps in the direction of coordinates X and/or Y into the individual exposure positions.

In order to prevent charging effects that can undesirably influence the direction of the exposure radiation, provision is made according to the present invention for each of layers $S_1$ through $S_3$ and substrate 1 to be connected, even before the exposure begins, to a ground potential to which the charge carriers can discharge without impediment. This connection is achieved by the fact that the shifting movement of stage 5 into position $Z_1$ is used to connect each individual one of layers $S_1$ through $S_3$, and substrate 1, to the ground potential.

Figure 3:
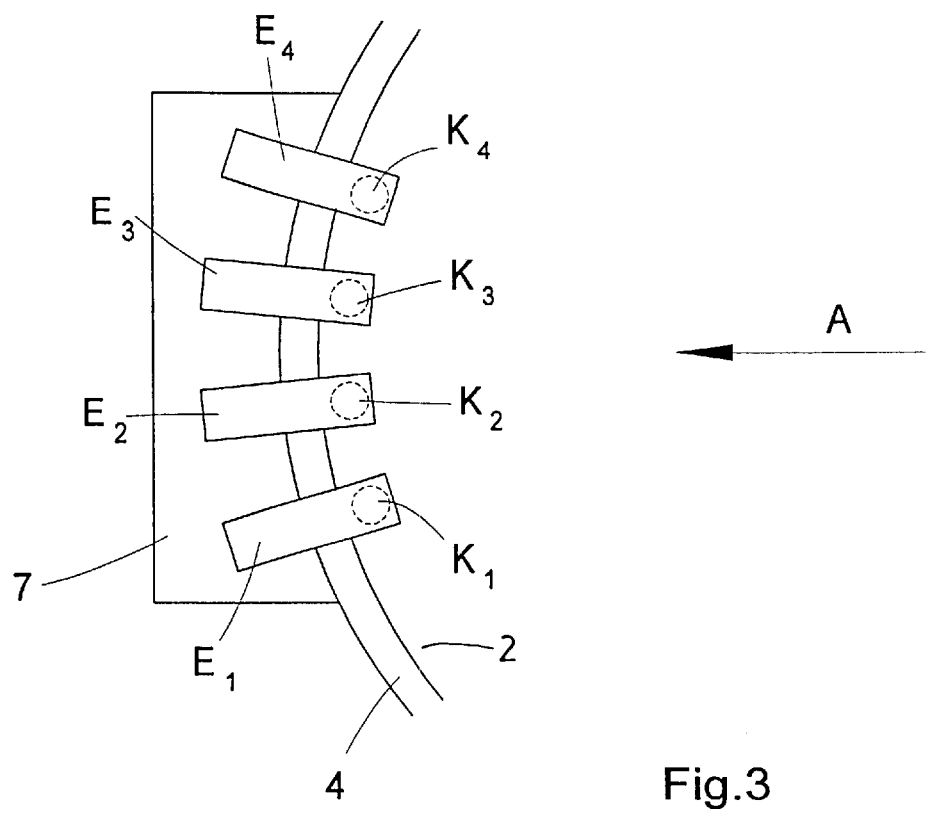
FIG. 3 shows a plan view of the substrate and contact tips.
Figure 4:
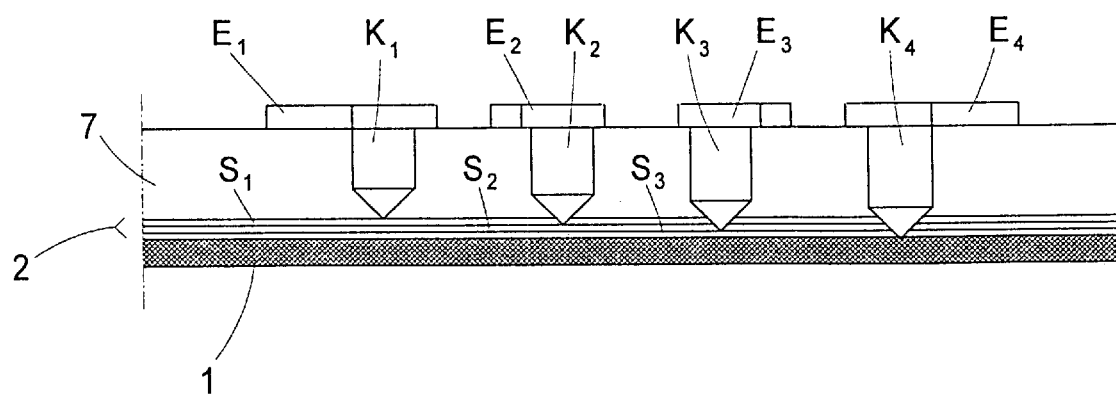
FIG. 4 shows the substrate and contact tips in a side view in direction A of FIG. 3.

For this purpose, there are provided above photoresist system 1 in the direction of coordinate Z, on a frame-mounted holding fixture 7, four contact tips $K_1$ through $K_4$, each of which is arranged on one of spring elements $E_1$ through $E_4$ which are configured as leaf springs. Of the four contact tips $K_1$ through $K_4$, contact tip $K_1$ arranged on spring element $E_1$ is associated with the layer $S_1$, contact tip $K_2$ arranged on spring element $E_2$ with the layer $S_2$, contact tip $K_3$ arranged on spring element $E_3$ with the layer $S_3$, and lastly contact tip $K_4$ arranged on spring element $E_4$ with substrate 1 (FIGS. 3, 4).

For the sake of clarity, this arrangement is depicted in FIG. 1 and FIG. 2 only with reference to spring element $E_3$ and contact tip $K_3$. It is evident here that spring element $E_3$ is attached at one end to a holding fixture 7, while contact tip $K_3$ is located in freely oscillating fashion at the other end. Holding fixture 7 is immovably joined to a device frame 11.

When stage 5 is then shifted in direction Z, surface 6 reaches contact tip $K_3$, which thus first comes to rest on surface 6, but as the shifting movement proceeds is pushed ahead of surface 6. The preload on spring element $E_3$, and thus also the surface pressure between the mutually contacting surface segments of contact surface 8 and surface 6, thereby increases. When the surface pressure becomes sufficiently great as the shifting movement proceeds, this causes the destruction of surface 6, and contact tip $K_3$ penetrates into the layer $S_1$. In this context, the penetration depth depends on the geometry of contact tip $K_3$, in particular on its tip angle $\alpha$ and tip radius R (cf. FIG. 6), and on the properties of spring element $E_3$ and the viscosity of the layer $S_1$.

With a suitable coordination of the tip angle $\alpha$, tip radius R, and spring element $E_3$ in terms of the viscosity and thickness of the layer $S_1$, contact tip $K_3$ passes through the layer $S_1$ and penetrates into the layer $S_2$. Here again, the penetration depth into the layer $S_2$ depends on the increase in force resulting from the rising spring preload or surface pressure as the shifting movement proceeds. The result of the rising surface pressure, again as a function of the consistency and of course also the thickness of layers $S_1$ and $S_2$, is that the layer $S_2$ is also penetrated and contact surface 8 comes into contact with the material of the layer $S_3$.

If the tip angle $\alpha$, tip radius R, spring element $E_3$, and viscosity and thickness of layers $S_1$ and $S_2$ are coordinated with one another with sufficient accuracy, an electrical contact is thus made to the layer $S_3$, via contact tip $K_3$, spring element $E_3$, and an electrically conductive connection 9 to the ground potential, exactly when position $Z_1$ is reached.

This situation is depicted in FIG. 2, from which it is evident that contact surface 8 of contact tip $K_3$ has penetrated into photoresist system 2 as far as the layer $S_3$. Not only has the electrically conductive connection been created between the layer $S_3$ and the ground potential, but also, because of the contact between contact surface 8 and the material of layers $S_1$ and $S_2$, these two layers have also been connected to the ground potential. When the exposure process then begins, electrical charges that form in undesired fashion are dissipated to the ground potential.

FIG. 3 shows, in a plan view looking in direction 3, contact tips $K_1$ through $K_4$ that are mechanically joined via spring elements $E_1$ through $E_4$ to holding fixture 7. In this context, contact-tips $K_1$ through $K_4$ are movable relative to one another, the movement direction corresponding approximately to the perpendicular to the drawing plane.

FIG. 4 shows spring elements $E_1$ through $E_4$ with contact tips $K_1$ through $K_4$ in a view in direction A of FIG. 3. It is evident here that contact tip $K_1$ is allocated to the layer $S_1$, contact tip $K_2$ to the layer $S_2$, contact tip $K_3$ to the layer $S_3$, and contact tip $K_4$ to substrate 1.

This allocation defines the fact that one of contact tips $K_1$ through $K_3$ is responsible in each case for electrical contacting to one of layers $S_1$ through $S_3$, and contact tip $K_4$ for electrical contacting to substrate 1. In this context, spring elements $E_1$ through $E_4$ and the geometries of contact tips $K_1$ through $K_4$ are to be coordinated with the thicknesses and viscosity of layers $S_1$ through $S_3$ in such a way that the surface pressures generated during the shifting movement of stage 5 are sufficient to allow each of contact tips $K_1$ through $K_3$ to come into contact with its respectively allocated layer $S_1$ through $S_3$, and contact tip $K_4$ with substrate 1.

The advantageous result of this is that without additional mechanical devices (in the form of rotational drives for the pins) or electrical contrivances (e.g. high voltage applied to the photoresist system), a reliable electrical connection from each of layers $S_1$ through $S_3$ and substrate 1 to the ground potential is ensured by way of the shifting movement alone.

Figure 5:
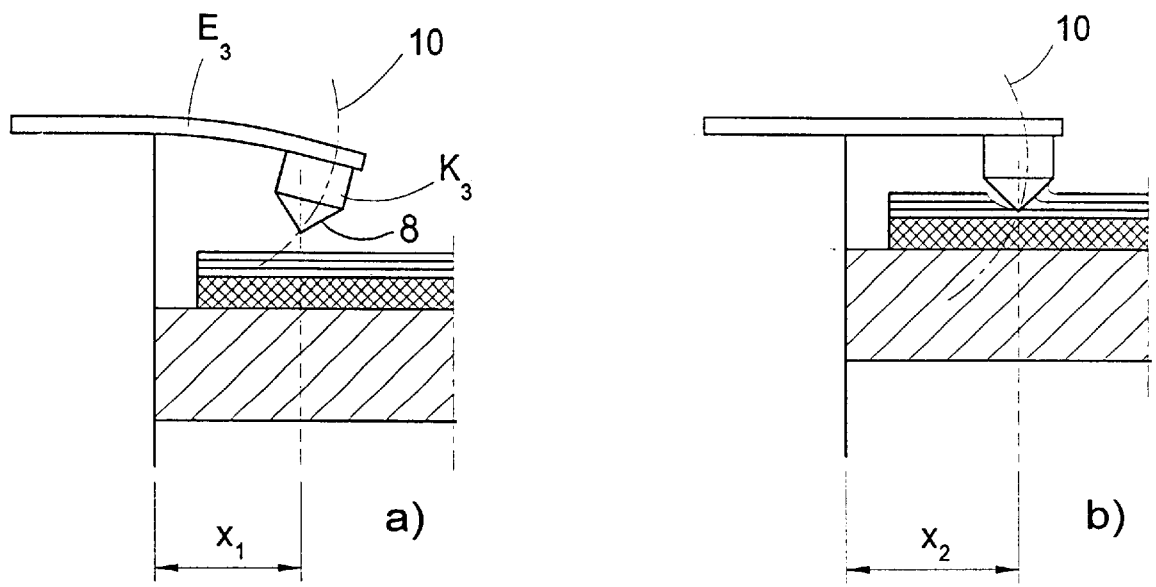
FIG. 5 shows the movement path of a contact tip during contacting.

FIG. 5 shows the movement path of a contact tip $K_3$ during contacting. Since each spring element $E_1$ through $E_4$ is immovably clamped in at one end, contact tips $K_1$ through $K_4$ move, as stage 5 is shifted, along a circular arc 10 whose radius is determined by the respective spring length. Since stage 5 is guided in linear fashion, however, the position of the respective contact points between contact tips $K_1$ through $K_4$ and coated substrate 1 changes in the direction of coordinates X and Y.

In this context, FIG. 5a) shows, for example, position $X_1$ of the contact point between contact tip $K_3$ and surface 6 shortly before initial contact. During penetration as shifting proceeds, however, the contact point moves increasingly toward position $X_2$ (cf. FIG. 5b)).

The result of this relative motion between contact tip $K_3$ and photoresist system 2 is that contact tip $K_3$ does not penetrate through layers $S_1$ and $S_2$ in a straight line corresponding to the shifting movement, but rather that a "scratch effect," so to speak, is produced during penetration; this is essentially important for making reliable contact. As a result, the material of layers $S_1$ and $S_2$ that are to be penetrated is not merely displaced, but is removed, so that an ohmic contact is reliably brought into being. In the process, layer material from the penetrated layers $S_1$ and $S_2$ also slides onto contact surface 8. The same is analogously true of the other three contact tips $K_1$, $K_2$, and $K_4$.

Figure 6:
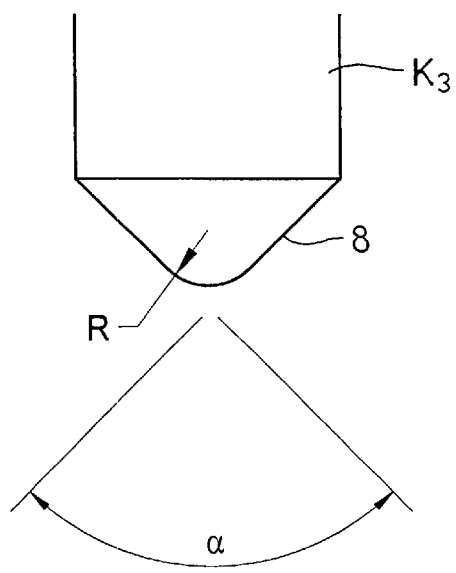
FIG. 6 shows an example of the geometry of a contact tip in detail.

FIG. 6 depicts the geometry of contact tip $K_3$, which here has, by way of example, a tip radius R=20 $\mu$m and a tip angle $\alpha$=30°. Taking into consideration the aforesaid material of layers $S_1$ and $S_2$ and layer thicknesses of 1 $\mu$m, with a correspondingly configured spring element $E_3$, this yields a downforce of contact surface 8 onto the layer material on the order of 0.1 to 2 N, which is sufficient to allow contact tip $K_3$ to penetrate through layers $S_1$ and $S_2$ to the layer $S_3$ during the shifting movement.

In alternative variant embodiments of the invention, it is of course possible to make the radius of circular arc 10 so large that (remaining with the example of contact tip $K_3$) penetration of the initial layers $S_1$ and $S_2$ takes place predominantly by material displacement. If the spring length of spring element $E_3$ is sufficient, the movement component X upon penetration of contact tip $K_3$ into photoresist system 2 is then so small that the scratch effect is absent and thus no material removal, and only material displacement, occurs. Linear guidance of contact tips $K_1$ through $K_4$ parallel to direction 3 is also conceivable, in which case one or more of the spring elements can be configured as helical springs.

The invention has been described in detail with particular reference to certain preferred embodiments thereof, but it will be understood that variations and modifications can be effected within the spirit and scope of the invention.

PARTS LIST

1 Substrate
2 Photoresist system
3 Direction of corpuscular radiation
4 Support plane
5 Stage
6 Surface of photoresist system
7 Holding fixture
8 Contact surface
9 Conductor
10 Circular arc
11 Device frame
$S_1$–$S_3$ Layers
$K_1$–$K_4$ Contact tips
$E_1$–$E_4$ Spring elements

What is claimed is:
1. A method for exposing a substrate, equipped with an n-layer photoresist system, with a corpuscular radiation, an electrically conductive connection being created between a ground potential and the substrate and/or at least one of the layers $S_1$ through $S_n$ of the photoresist system in order to dissipate electrical charges, wherein in a process step before exposure begins, the layers $S_1$ through $S_n$ are brought into electrically conductive connection with the ground potential by way of a quantity of m contact tips $K_1$ through $K_m$, by the fact that the coated substrate and the contact tips $K_1$ through $K_m$ are moved relative to one another until the electrically conductive connection between the ground potential and each individual layer $S_1$ through $S_n$ is created by way of at least one of the contact tips $K_1$ through $K_m$ in each case.

2. The method as defined in claim 1, wherein in addition an electrically conductive connection is created between the ground potential and the substrate via at least one of the contact tips $K_1$ through $K_m$.

3. The method as defined in claim 1, wherein a contact tip $K_1$ is advanced until contact is made with the layer $S_1$, a contact tip $K_2$ is advanced through the layer $S_1$ until contact is made with the layer $S_2$, a contact tip $K_3$ is advanced through the layers $S_1$ and $S_2$ until contact is made with the layer $S_3$, and so forth.

4. The method as defined in claim 2, wherein a contact tip $K_1$ is advanced until contact is made with the layer $S_1$, a contact tip $K_2$ is advanced through the layer $S_1$ until contact is made with the layer $S_2$, a contact tip $K_3$ is advanced through the layers $S_1$ and $S_2$ until contact is made with the layer $S_3$, and lastly a contact tip $K_m$ is advanced through the layers $S_1$ through $S_n$ until contact is made with the substrate.

5. The method as defined in claim 1, wherein individual ones of the layers $S_1$ through $S_n$ and/or the substrate 1 are brought into connection with the ground potential via further contact tips $K_1$ through $K_m$ whose quantity corresponds to the difference m–n.

6. The method as defined in claim 1, wherein the advance movement of the contact tips $K_1$ through $K_m$ is accomplished at least almost parallel to the direction of the corpuscular radiation, the material of the respective layers $S_1$ through $S_n$ to be penetrated being displaced until each of the contact tips $K_1$ through $K_m$ has reached the layer $S_1$ through $S_n$, or the substrate, allocated to it.

7. The method as defined in claim 1, wherein the advance movements of the individual contact tips $K_1$ through $K_m$ have movement components in the X and/or Y coordinates, as a result of which the material of the respective layers $S_1$ through $S_n$ to be penetrated is removed until each of the contact tips $K_1$ through $K_m$ has reached the layer $S_1$ through $S_n$, or the substrate, associated with it.

8. An apparatus for patterning a substrate that includes a plurality of layers $S_1$ through $S_n$ of a photoresist system, in which a corpuscular radiation is directed onto the photoresist system for an exposure, comprising:

a plurality of contact tips $K_1$ through $K_m$ for dissipating to a ground potential the electrical charges that form during exposure in the photoresist system, wherein at least one of m contact tips $K_1$ through $K_m$ is allocated to each of the layers $S_1$ through $S_n$;

each contact tip $K_1$ through $K_m$ is connected to the ground potential via an electrically conductive connection; and the coated substrate and the contact tips $K_1$ through $K_m$ are arranged movably relative to one another in the direction of the corpuscular radiation.

9. The apparatus as defined in claim 8, wherein at least one of the contact tips $K_1$ through $K_m$ is allocated to the substrate.

10. The apparatus as defined in claim 8, wherein the coated substrate is arranged on a support plane that is movable in the direction of the corpuscular radiation as far as a position $Z_1$, while the contact tips $K_1$ through $K_m$ are separately joined mechanically to a frame-mounted holding fixture via spring elements $E_1$ through $E_m$, each of the contact tips $K_1$ through $K_m$ being movable, in response to a force $F_1$ through $F_m$ allocated to it and predefined by the spring elements $E_1$ through $E_m$, relative to one another and relative to the holding fixture.

11. The apparatus as defined in claim 10, wherein the geometry of the contact tip $K_1$ and the force $F_1$ defined by the spring element $E_1$ are coordinated, with one another and in terms of the thickness and viscosity of the layer $S_1$, in such a way that when the substrate is moved to the position $Z_1$, the electrically conductive connection between the contact tip $K_1$ and the ground potential is created.

12. The apparatus as defined in claim 8, wherein the geometry of the contact tip $K_2$ and a force $F_2$ are coordinated, with one another and in terms of the thickness and viscosity of the layer $S_1$, in such a way that when the substrate is moved into the position $Z_1$, the layer $S_1$ is penetrated by the contact tip $K_2$ and the electrically conductive connection between the layer $S_2$ and the ground potential is created via the contact tip $K_2$; the geometry of the contact tip $K_3$ and a force $F_3$ are coordinated, with one another and in terms of the thickness and viscosity of the layers $S_1$ and $S_2$, in such a way that when the substrate is moved to the position $Z_1$, the layers $S_1$ and $S_2$ are penetrated by the contact tip $K_3$ and the electrically conductive connection between the layer $S_3$ and the ground potential is created via the contact tip $K_3$; and the geometry of a contact tip $K_n$ and a force $F_n$ are coordinated, with one another and in terms of the thickness and viscosity of the layers $S_1$ through $S_{n-1}$, in such a way that when the substrate is moved to the position $Z_1$, the layers $S_1$ through $S_{n-1}$ are penetrated by the contact tip $K_n$ and the electrically conductive connection between the layer $S_n$ and the ground potential is ensured via the contact tip $K_n$.

13. The apparatus as defined in claim 8, wherein the photoresist system comprises three layers $S_1$ through $S_3$, the layer $S_1$ comprising a polymer photoresist of the designation PMMA, the layer $S_2$ comprising silicon nitride, and the layer $S_3$ comprising the polymer photoresist.

14. The apparatus as defined in claim 13, wherein four spring elements $E_1$ through $E_4$, configured as leaf springs, are provided, each of which is joined immovably at one end to the holding fixture and at the opposite end to the allocated contact tip $K_1$ through $K_4$.

15. The apparatus as defined in claim 14, wherein the forces $F_1$ through $F_4$ of the spring elements $E_1$ through $E_4$ lie in the range from 0.1 N to 2 N, the contact surfaces of the contact tips $K_1$ through $K_4$ are equipped with radii R in the range from 20 $\mu$m to 100 $\mu$m, and the thicknesses of the layers $S_1$ through $S_3$ are approximately 0.5 $\mu$m to 2 $\mu$m.

* * * * *